United States Patent
Ballnik et al.

(10) Patent No.: US 9,247,678 B2
(45) Date of Patent: Jan. 26, 2016

(54) METHOD AND APPARATUS FOR CONTROLLING A COOLANT CIRCUIT THERMALLY COUPLED TO A POWER ELECTRONICS DEVICE

(71) Applicant: GM GLOBAL TECHNOLOGY OPERATIONS LLC, Detroit, MI (US)

(72) Inventors: Christopher D S Ballnik, Milford, MI (US); David J. Liller, Plymouth, MI (US); Xiaowen Luo, Canton, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 371 days.

(21) Appl. No.: 13/945,018

(22) Filed: Jul. 18, 2013

(65) Prior Publication Data

US 2015/0022973 A1  Jan. 22, 2015

(51) Int. Cl.
*H05K 7/20* (2006.01)

(52) U.S. Cl.
CPC ............ *H05K 7/20918* (2013.01); *H05K 7/209* (2013.01); *H05K 7/20945* (2013.01); *H05K 7/2089* (2013.01)

(58) Field of Classification Search
CPC ..................... H05K 7/2089–7/20945
See application file for complete search history.

(56) References Cited

U.S. PATENT DOCUMENTS

| 4,133,185 | A | 1/1979 | Dickey |
| 4,779,577 | A * | 10/1988 | Ritter .................. F01P 7/02 123/41.05 |
| 8,015,954 | B2 | 9/2011 | Kardos |
| 8,162,086 | B2 | 4/2012 | Robinson |
| 8,251,676 | B2 | 8/2012 | Fleischmann et al. |
| 8,311,708 | B2 | 11/2012 | Kerns |
| 8,948,946 | B2 * | 2/2015 | Ballnik ............. B60L 11/00 123/41.02 |
| 8,976,526 | B2 * | 3/2015 | Kulkarni ........... H02M 7/003 307/10.6 |
| 2012/0167842 | A1 * | 7/2012 | Zysk .................. F01P 3/18 123/41.05 |

* cited by examiner

*Primary Examiner* — Gregory Thompson

(57) ABSTRACT

A vehicle system includes a power electronics device and a coolant circuit thermally coupled to the power electronics device. The coolant circuit includes a fluidic pump and a fluid/air heat exchanger, an air pump configured to transfer air across the fluid/air heat exchanger, and a shutter device configured to control airflow across the fluid/air heat exchanger. A controller controls the fluidic pump to control coolant flow through the fluid/air heat exchanger to reject heat from the power electronics device to the coolant and correspondingly controls the air pump and the shutter device to control airflow across the fluid/air heat exchanger to reject heat from the coolant to achieve a preferred heat rejection from the power electronics device.

15 Claims, 4 Drawing Sheets

METHOD AND APPARATUS FOR CONTROLLING A COOLANT CIRCUIT THERMALLY COUPLED TO A POWER ELECTRONICS DEVICE

TECHNICAL FIELD

This disclosure is related to cooling systems for on-vehicle power electronics devices.

BACKGROUND

The statements in this section merely provide background information related to the present disclosure and may not constitute prior art.

Known vehicle powertrain system systems include one or more torque actuators coupled to a transmission that transfers torque to a driveline for tractive effort. Known torque actuators include internal combustion engines and electric motor/generators. On-vehicle power electronics devices are employed to operate electric motor/generators, and can generate waste heat in the process. Service life of an electronic device, e.g., an on-vehicle power electronics device, can be shortened when exposed to temperatures that exceed design specifications. On-vehicle cooling circuits can be employed to manage temperature in an on-vehicle power electronics device. Elements of cooling circuits, e.g., fans and pumps, consume electric power thus affecting overall vehicle fuel consumption.

SUMMARY

A vehicle system includes a power electronics device and a coolant circuit thermally coupled to the power electronics device. The coolant circuit includes a fluidic pump and a fluid/air heat exchanger, an air pump configured to transfer air across the fluid/air heat exchanger, and a shutter device configured to control airflow across the fluid/air heat exchanger. A controller controls the fluidic pump to control coolant flow through the fluid/air heat exchanger to reject heat from the power electronics device to the coolant and correspondingly controls the air pump and the shutter device to control airflow across the fluid/air heat exchanger to reject heat from the coolant to achieve a preferred heat rejection from the power electronics device.

BRIEF DESCRIPTION OF THE DRAWINGS

One or more embodiments will now be described, by way of example, with reference to the accompanying drawings, in which.

DETAILED DESCRIPTION

Figure 1:
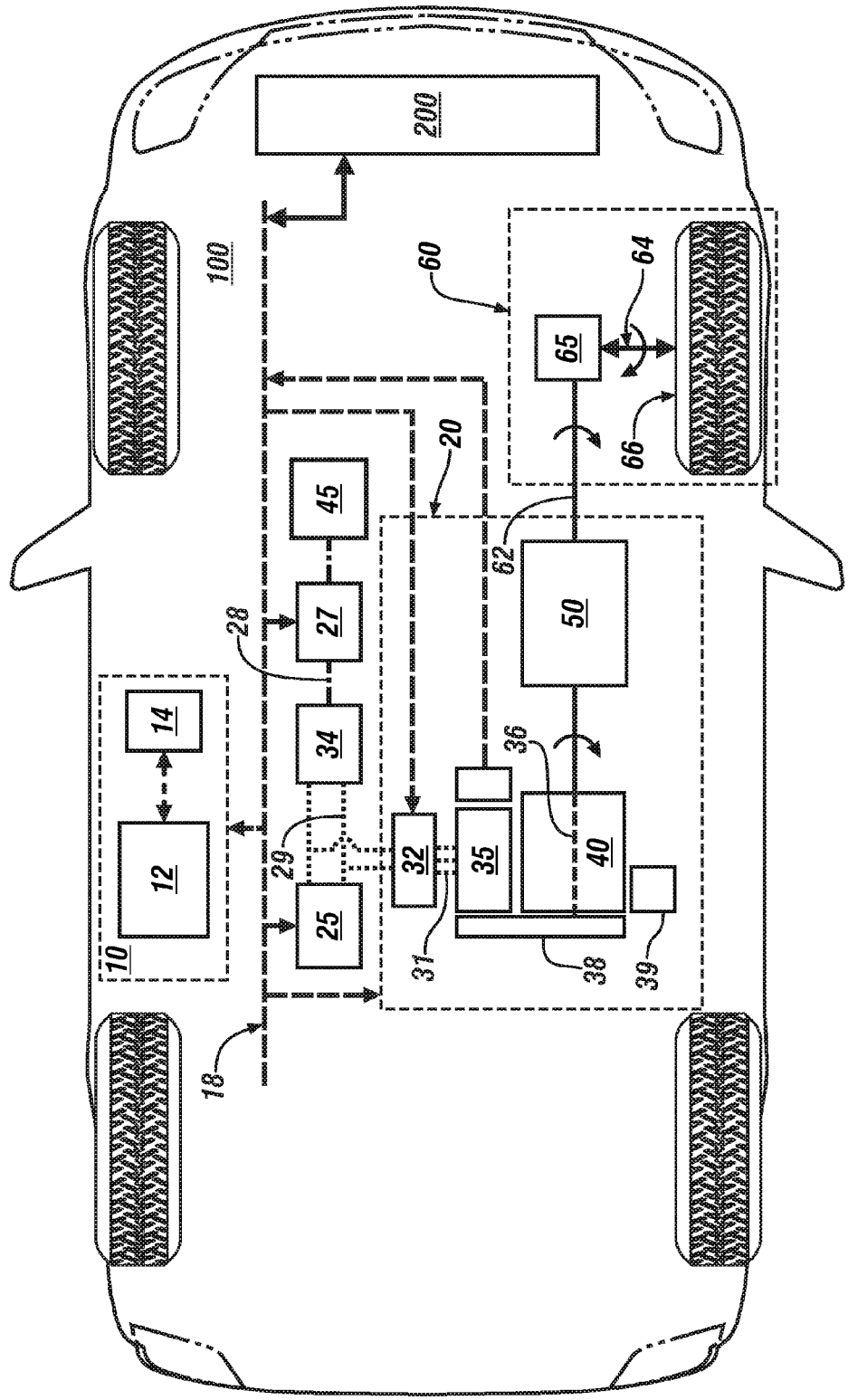
FIG. 1 illustrates a vehicle including a powertrain system, driveline and cooling system, all of which is controlled by a control system in accordance with the disclosure.

Referring now to the drawings, wherein the showings are for the purpose of illustrating certain exemplary embodiments only and not for the purpose of limiting the same, FIG. 1 schematically shows a vehicle 100 including a powertrain system 20 coupled to a driveline 60 including a power electronics cooling circuit 200, all of which are controlled by a control system 10. The vehicle 100 is a non-limiting embodiment that is employed to illustrate the concepts of subsequent figures. Like numerals refer to like elements throughout the description.

The powertrain system 20 includes an internal combustion engine 40 that mechanically couples to a transmission 50 via an output member coupled to a crankshaft 36 and mechanically couples to an electrically-powered torque machine 35 via a pulley mechanism 38. The electrically-powered torque machine 35 and the internal combustion engine 40 are torque-generating devices. The electrically-powered torque machine 35 includes an output member that mechanically rotatably couples to the crankshaft 36 of the engine 40 via the pulley mechanism 38, which provides a mechanical power path therebetween. The transmission 50 includes an output member 62 that couples to the driveline 60. The engine 40 may include a low-voltage solenoid-actuated electrical starter 39 for starting in response to a key-crank event in one embodiment.

The engine 40 is preferably a multi-cylinder internal combustion engine that converts fuel to mechanical power through a combustion process. The torque machine 35 is preferably a high-voltage multi-phase electric motor/generator that is controlled by an inverter module 32 that electrically connects to the torque machine 35 via a multi-phase motor control power bus 31. The torque machine 35 is configured to convert stored electric energy to mechanical power and convert mechanical power to electric energy that may be stored in a high-voltage battery 25. The inverter module 32 is configured with suitable control circuits including power transistors, e.g., IGBTs for transforming high-voltage DC electric power to high-voltage AC electric power and transforming high-voltage AC electric power to high-voltage DC electric power. The inverter module 32 preferably employs pulse-width-modulating (PWM) control to convert stored DC electric power originating in the high-voltage battery 25 to AC electric power to drive the torque machine 35 to generate torque. Similarly, the inverter module 32 converts mechanical power transferred to the torque machine 35 to DC electric power to generate electric energy that is storable in the high-voltage battery 25, including as part of a regenerative control strategy. It is appreciated that the inverter module 32 is configured to receive motor control commands and control inverter states to provide the motor drive and regeneration functionality.

In one embodiment, a DC/DC electric power converter 34 electrically connects to a low-voltage power bus 28 and a low-voltage battery 27, and electrically connects to the high-voltage bus 29. Such electric power connections are known and not described in detail. The low-voltage battery 27 electrically connects to an auxiliary power system 45 to provide low-voltage electric power to low-voltage systems on the vehicle, including, e.g., electric windows, HVAC fans, seats, and the low-voltage solenoid-actuated electrical starter 39.

The transmission 50 preferably includes one or more differential gear sets and activatable clutches configured to effect torque transfer in one of a plurality of fixed-gear operating modes over a range of speed ratios between the engine 40 and the output member 62. The transmission 50 includes any suitable configuration, and is preferably configured as an automatic transmission to automatically shift between the fixed-gear operating modes to operate at a gear ratio that achieves a preferred match between an operator torque request and an engine operating point. The driveline 60 may include a differential gear device 65 that mechanically couples to an axle 64 or half-shaft that mechanically couples to a wheel 66 in one embodiment. The driveline 60 transfers tractive power between the transmission 50 and a road surface.

The control system 10 includes control module 12 that signally connects to an operator interface 14. The control module 12 preferably signally and operatively connects to individual elements of the powertrain system 20 either directly or via a communications bus 18. The control module 12 signally connects to sensing devices of each of the high-voltage battery 25, the inverter module 32, the torque machine 35, the engine 40, the transmission 50 and the power electronics cooling circuit 200 to monitor operation and determine parametric states thereof. The operator interface 14 of the vehicle 100 includes a plurality of human/machine interface devices through which the vehicle operator commands operation of the vehicle 100, including, e.g., an ignition switch to enable an operator to crank and start the engine 40, an accelerator pedal, a brake pedal, a transmission range selector (PRNDL), a steering wheel, and a headlamp switch, among others.

The powertrain system 20 includes a communications scheme including the communications bus 18 to effect communications in the form of sensor signals and actuator command signals between the control system 10 and elements of the powertrain system 20. The communications scheme effects information transfer to and from the control system 10 using one or more communications systems and devices, including, e.g., the communications bus 18, a direct connection, a local area network bus, a serial peripheral interface bus, and wireless communications.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

Figure 2:
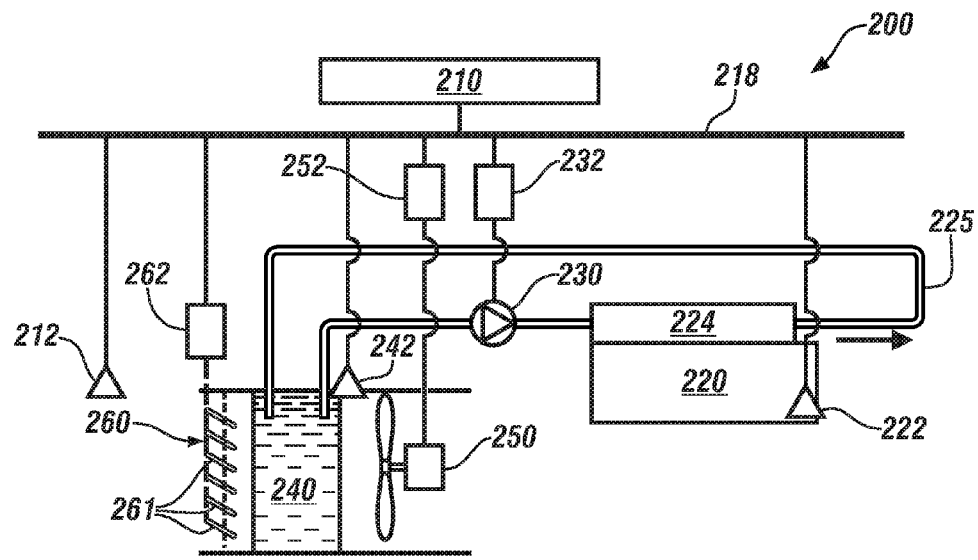
FIG. 2 illustrates an embodiment of a power electronics cooling circuit employed on a vehicle, in accordance with the disclosure.

FIG. 2 schematically shows an embodiment of the power electronics cooling circuit 200 employed on a vehicle, e.g., the vehicle 100 of FIG. 1. The power electronics cooling circuit 200 is preferably separate and distinct from an engine cooling circuit, including employing a separate fluid/air heat exchanger (radiator) 240 and a separate coolant pump 230. The power electronics cooling circuit 200 includes one or a plurality of power electronics device(s) 220, pump 230, radiator 240, a controllable air pump (fan) 250, and a controllable air shutter system (shutter) 260. A controller 210 controls operation of the power electronics cooling circuit 200 and may be signally and/or physically integrated into the control system 10 of FIG. 1. A temperature sensor 212 signally connected to the controller 210 may be employed to monitor ambient air temperature. The power electronics device 220 may be any on-vehicle power electronics system that generates waste heat, including, e.g., an auxiliary power module such as the DC/DC electric power converter 34, a motor/generator unit such as the torque machine 35, and/or a power inverter such as the inverter module 32, as of FIG. 1. The power electronics device 220 includes a temperature sensor 222 in one embodiment that is configured to monitor one or more temperature(s) thereof. The temperature sensor 222 may be a thermocouple, thermistor, or other suitable temperature monitoring device that is configured to monitor one or more device temperature(s). Alternatively or in addition, the device temperature(s) may be determined using modeling, calibration, or another analytical process that employs information associated with operating the power electronics device 220. A fluid heat exchanger 224 connects to the power electronics device 220 to absorb and transfer heat that is rejected therefrom. The fluid heat exchanger 224 may consist of a separate attached element or may be integrated into the structure of the power electronics device 220, and in either arrangement conductively couples to a heat sink to transfer and dissipate heat generated by the power electronics device 220. The fluidic heat exchanger 224 fluidly connects via conduit 225 to the radiator 240. A coolant sensor 242 monitors temperature of coolant in the fluidic circuit. The pump 230 is a controllable fluidic pump device that circulates coolant between the radiator 240 and the power electronics device 220. In one embodiment the controllable fluidic pump 230 is controllable via pump controller 232 to either an ON state associated with a maximum coolant flowrate or an OFF state associated with zero coolant flowrate. Alternatively, the controllable fluidic pump 230 may be controllable using a pulse-width-modulated (PWM) signal generated by the pump controller 232 to control the pump 230 to achieve a selectable coolant flowrate that falls between the OFF state and the maximum coolant flowrate.

The fan 250 may include a single one or a plurality of air pump devices that are configured within the vehicle to pump ambient air across the radiator 240 to effect heat rejection. The fan 250 is preferably actuated by a controllable electric motor that is controlled by a fan motor actuator 252. In one embodiment the fan 250 is controllable via the fan motor actuator 252 to either an ON state associated with a maximum air flowrate or an OFF state associated with zero forced air flowrate. Alternatively, the fan 250 may be controllable via fan motor actuator 252 to one of a plurality of selectable air flowrates that range between the OFF state and the maximum air flowrate.

The shutter 260 may include a single one or a plurality of shutter elements 261 that are configured to control magnitude of surface area of the radiator 240 across which air flows in response to a shutter actuator 262 that controls position of the shutter elements 261. The shutter elements 261 may be individually controlled, controlled in unison in response to a common command, or any suitable combination of independent and unison controls. The shutter 260 and fan 250 are controllable to manage magnitude of airflow across the radiator 240 to effect heat rejection. The shutter actuator 262, fan motor actuator 252, pump controller 232, coolant sensor 242, device temperature sensor 222, and temperature sensor 212 signally connect to the controller 210 via a communications bus 218 to effect communications in the form of sensor signals and actuator command signals. The communications bus 218 can encompass a direct connection, a local area network bus, a serial peripheral interface bus, and wireless communications.

Conservation of energy dictates that total energy in a system can be determined in relationship to added heat and added work, which can be expressed as the following relationship:

$$E_{tot} = Q + W \quad [1]$$

wherein
$E_{tot}$ is total system energy,
Q is added heat, and
W is added work.

In a heat exchanger system employing multiple heat sources and a radiator, this relationship can be expressed as follows:

$$E_{tot} = Q_{radiator} + \Sigma Q_{devices} + W \quad [2]$$

wherein
$E_{tot}$ is total system energy,
$Q_{radiator}$ is heat transfer from the radiator,
$\Sigma Q_{devices}$ is heat transfer from the multiple heat source devices, and
W is added work.

Thus, it is appreciated that in a cooling system for a plurality of power electronics devices, the heat transfer across the power electronics devices is cumulative.

The magnitude of heat rejected by the fluid/air heat exchanger, e.g., radiator 240 can be described in accordance with the following relationship:

$$(Q_{radiator} = (\dot{m}_{air} \times C_{pair}) \times \epsilon_{radiator} \times [T_{coolant} - T_{air}] \quad [3]$$

wherein
$Q_{radiator}$ is heat transfer across the radiator,
$\dot{m}_{air}$ is mass flowrate of air across the radiator,
$C_{pair}$ is heat capacity of air,
$\epsilon_{radiator}$ is heat transfer efficiency of the radiator,
$T_{coolant}$ is temperature of the coolant, and
$T_{air}$ is ambient air temperature.

The heat capacity of air $C_{pair}$ is determined in relationship to vehicle speed, shutter open position, and cooling fan speed.

The magnitude of heat added by one of the power electronics devices can be described in accordance with the following relationship:

$$Q_{device} = (\dot{m} C_p)_{coolant} \times \epsilon_{device} \times [T_{inlet\ coolant} - T_{outlet\ coolant}] \quad [4]$$

wherein
$Q_{device}$ is heat transfer across the power electronics device,
$\dot{m}$ is mass flowrate of coolant,
$C_p$ is heat capacity of coolant,
$\epsilon_{device}$ is heat transfer efficiency of the power electronics device,
$T_{inlet\ coolant}$ is inlet temperature of the coolant, and
$T_{outlet\ coolant}$ is outlet temperature of the coolant.

The power electronics cooling circuit 200 is configured to effect heat transfer between the power electronics device and the coolant to achieve a preferred operating temperature in the power electronics device. The preferred operating temperature in the power electronics device can be a single target temperature or a target temperature range, preferably with some allowance for temperature hysteresis to account for thermal lag and other factors. As described herein, the configuration and control of the power electronics cooling circuit 200 is intended to effect a magnitude of heat rejection from the power electronics device that achieves a preferred operating temperature of the power electronics device. This includes controlling operation of the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to ambient air to achieve the preferred heat rejection from the power electronics device.

FIGS. 3, 4, 5, 6, and 7 schematically show elements of a control scheme 300 for managing heat rejection in a cooling circuit referred to herein as a power electronics cooling loop (PECL), e.g., the power electronics cooling circuit 200 of FIG. 2 that is employed on the vehicle 100 of FIG. 1. The control scheme 300 includes determining a coolant flow request 395 that can be employed by a pump controller to control a coolant pump, and determining a final airflow request 365 that can be employed by a fan motor actuator to control a fan and a shutter actuator to control shutter opening(s) to effect a magnitude of heat rejection from the power electronics device that achieves a preferred operating temperature of the power electronics device.

The coolant flow request 395 and the final airflow request 365 are preferably determined to achieve a preferred operating temperature of the power electronics device. This includes controlling operation of the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to ambient air to achieve the preferred heat rejection from the power electronics device by balancing the heat transfer across the power electronics device $Q_{device}$ as determined in EQ. [4] with the heat transfer across the radiator $Q_{radiator}$ as determined in EQ. [3].

Figure 3:
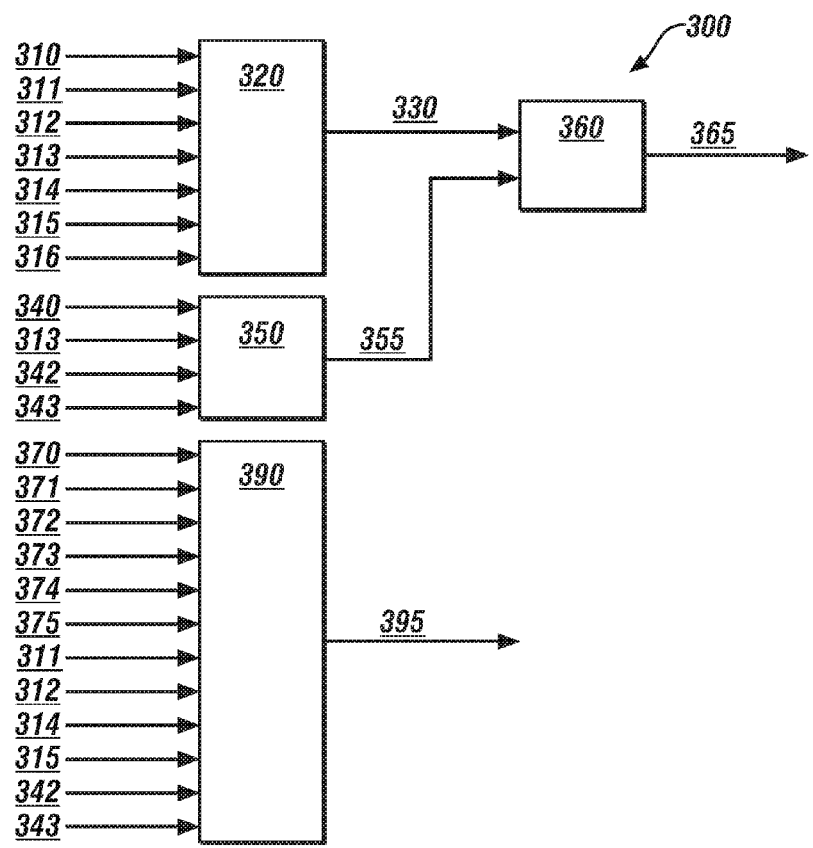
FIG. 3 illustrates inputs and outputs for a power electronics cooling loop (PECL) temperature-based routine that determines a first airflow request and a device temperature-based routine that determines a second airflow request, and inputs and outputs for a fluid request control and arbitration logic routine to determine a coolant flow request, in accordance with the disclosure.

FIG. 3 schematically shows inputs and outputs of the control scheme 300 for managing heat rejection in a power electronics cooling loop (PECL), e.g., the power electronics cooling circuit 200 of FIG. 2 that is employed on the vehicle 100 of FIG. 1. The control scheme 300 includes a PECL temperature-based routine 320 determines a first airflow request 330, a device temperature-based routine 350 that determines a second airflow request 355, an arbitration routine 360, and a fluid request control and arbitration logic routine 390. The arbitration routine 360 executes logic that arbitrates between the first and second airflow requests 330, 355 to determine the final airflow request 365.

Monitored inputs to the PECL temperature-based routine 320 include component enable information 310, PECL temperature 311, which is based upon a temperature input from the coolant sensor 242 configured to monitor temperature of coolant in the fluidic circuit, PECL temperature validity indicator 312, an underhood airflow capacity (CFM) 313, outside (ambient) air temperature 314, which is based upon input from the temperature sensor 212 configured to monitor ambient air temperature, outside air temperature validity indicator 315, and a valid communications indicator 316. Monitored inputs to the device temperature-based routine 350 include device enablement information 340, the underhood airflow capacity 313, component temperature 342 and component temperature validity 343.

Monitored inputs to the fluid request control and arbitration logic routine 390 include propulsion information 370, battery charging information 371, system voltage information 372, vehicle noise/vibration/harshness information 373, cooling request(s) 374, cooling request(s) validity(ies) 375, the PECL temperature 311, the PECL temperature validity indicator 312, the outside (ambient) air temperature 314, the outside air temperature validity indicator 315, the component temperature 342 and the component temperature validity 343.

Figure 4:
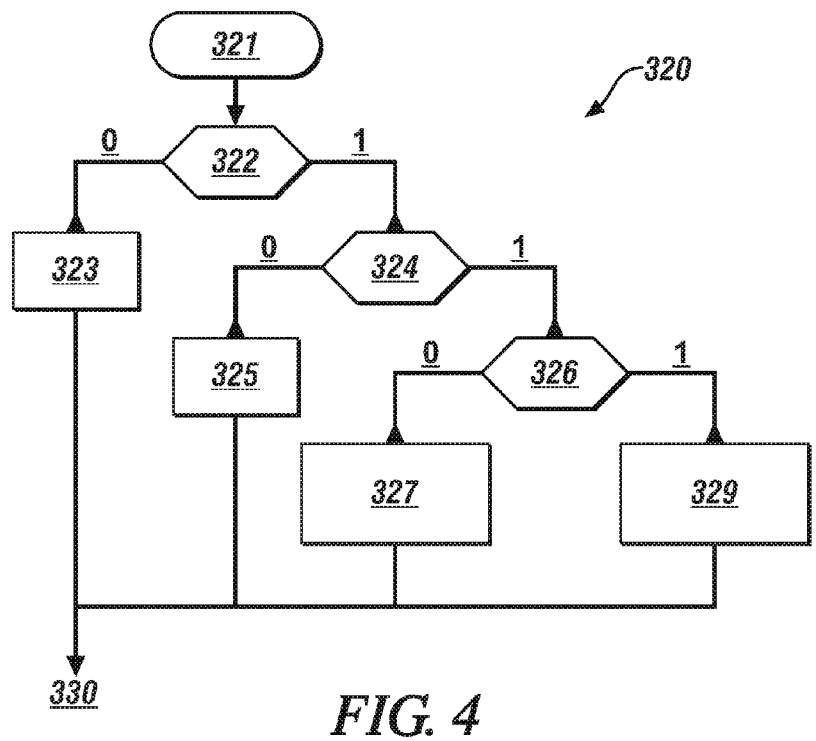
FIG. 4 illustrates details of the PECL temperature-based routine that periodically executes to determine the first airflow request during ongoing vehicle and powertrain operation, in accordance with the disclosure.

FIG. 4 shows details of the PECL temperature-based routine 320 that periodically executes to determine the first airflow request 330 during ongoing vehicle and powertrain operation. Table 1 is provided as a key to FIG. 4 wherein the numerically labeled blocks and the corresponding functions are set forth as follows, corresponding to the PECL temperature-based routine 320.

TABLE 1

| BLOCK | BLOCK CONTENTS |
|---|---|
| 321 | Start |
| 322 | Determine whether cooling pump is ON or OFF |
| 323 | Set default airflow request associated with cooling pump OFF |
| 324 | Determine whether PECL temperature is valid |
| 325 | Set airflow request associated with invalid PECL temperature |
| 326 | Determine whether outside air temperature is valid |
| 327 | Set airflow request based upon PECL temperature |
| 328 | Set airflow request based upon PECL temperature and outside air temperature |

The PECL temperature-based routine 320 includes, after starting (321) determining whether the cooling pump is ON or OFF (322). When the cooling pump is OFF (322)(0), a minimum default airflow request associated with cooling pump OFF is set as the first airflow request 330, and includes a calibrated value that indicates to the arbitration routine 360 that the cooling pump is OFF and indicates there is no urgent need for cooling in the power electronics device (323).

When the cooling pump is ON (322)(1), it is determined whether the PECL temperature is valid (324). When the PECL temperature is invalid (324)(0), an airflow request associated with the invalid PECL temperature is set as the first airflow request 330, and includes a calibrated value that indicates to the arbitration routine 360 that the cooling pump is ON and the PECL temperature is invalid (325).

When the PECL temperature is valid (324)(1), it is determined whether the outside air temperature is valid (326). When the outside air temperature is invalid (326)(0), an airflow request associated with only the PECL temperature is set as the first airflow request 330 (327). The first airflow request 330 associated with only the PECL temperature can be determined as a direct relation between airflow and PECL temperature, with zero airflow commanded when the PECL temperature is less than a minimum temperature and a maximum airflow when the PECL temperature is greater than a maximum temperature, with a temperature-related gradation of airflow and allowance for hysteresis therebetween. The relation between the airflow request and PECL temperature including the minimum and maximum temperatures and the temperature-related gradation of airflow can be developed experimentally, empirically, predictively, through modeling, or other suitable techniques, and executed using any suitable scheme, including e.g., a one-dimensional calibration table or an executable equation.

When the outside air temperature is valid (326)(0), an airflow request associated with both the PECL temperature and the outside air temperature is set as the first airflow request 330 (329). The first airflow request 330 associated with both the PECL temperature and the outside air temperature can be determined as a direct relation between airflow, PECL temperature and the outside air temperature, with zero airflow commanded when the PECL temperature is less than a minimum temperature and a maximum airflow when the PECL temperature is greater than a maximum temperature, with a gradation of airflow based upon both the PECL temperature and the outside air temperature and allowance for hysteresis therebetween. The relation between the airflow request, the outside air temperature and the PECL temperature including the minimum and maximum temperatures and the PECL temperature and outside air temperature-related gradations of airflow can be developed experimentally, empirically, predictively, through modeling, or other suitable techniques, and executed using any suitable scheme, including e.g., a two-dimensional calibration table or an executable equation.

Figure 5:
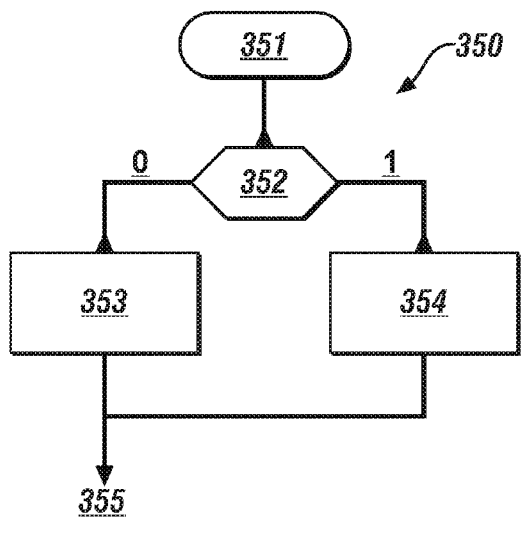
FIG. 5 illustrates details of a device temperature-based routine that periodically executes to determine the second airflow request during ongoing vehicle and powertrain operation, in accordance with the disclosure.

FIG. 5 shows details of the device temperature-based routine 350 that periodically executes to determine the second airflow request 355 during ongoing vehicle and powertrain operation. Table 2 is provided as a key to FIG. 5 wherein the numerically labeled blocks and the corresponding functions are set forth as follows, corresponding to the device temperature-based routine 350.

TABLE 2

| BLOCK | BLOCK CONTENTS |
|---|---|
| 351 | Start |
| 352 | Determine whether cooling pump is ON or OFF |
| 353 | Set default airflow request associated with cooling pump OFF |
| 354 | Set airflow request based upon device temperature |

The device temperature-based routine 350 includes, after starting (351) determining whether the cooling pump is ON or OFF (352). When the cooling pump is OFF (352)(0), a default airflow request associated with cooling pump OFF is set as the second airflow request 355, and includes a calibration value that indicates to the arbitration routine 360 that the cooling pump is OFF (353).

When the cooling pump is ON (352)(1), an airflow request associated with the device temperature is set as the second airflow request 355 (354). The second airflow request 355 associated with the device temperature can be determined as a direct relation between airflow and device temperature, with zero airflow commanded when the device temperature is less than a minimum temperature and a maximum airflow when the device temperature is greater than a maximum temperature, with a temperature-related gradation of airflow and allowance for hysteresis therebetween. The relation between the airflow request and the device temperature can be developed experimentally, empirically, predictively, through modeling, or other suitable techniques, and executed using any suitable scheme, including e.g., a one-dimensional calibration table or an executable equation.

Figure 6:
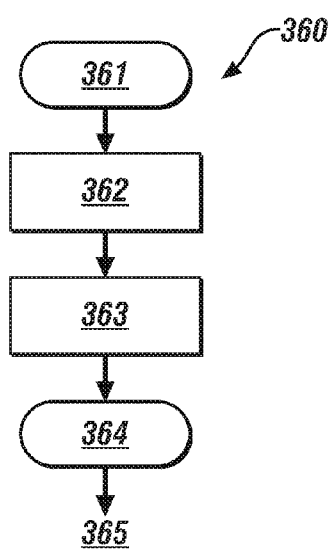
FIG. 6 illustrates details of an arbitration routine that periodically executes to arbitrate between the first and second airflow requests to determine the final airflow request, in accordance with the disclosure.

FIG. 6 shows details of the arbitration routine 360 that periodically executes to arbitrate between the first and second airflow requests 330, 355 to determine the final airflow request 365. Table 3 is provided as a key to FIG. 6 wherein the numerically labeled blocks and the corresponding functions are set forth as follows.

TABLE 3

| BLOCK | BLOCK CONTENTS |
|---|---|
| 361 | Start |
| 362 | Determine maximum of the first and second airflow requests |
| 363 | Set final airflow request as the maximum airflow request limited within a predetermined range |
| 364 | End |

The arbitration routine 360 includes, after starting (361), determining a maximum of the first and second airflow requests 330,355 (362). The final airflow request 365 is determined, and is the maximum of the first and second airflow requests 330,355 subject to limitation within a predetermined airflow range (363). The predetermined airflow range is determined based upon the maximum airflow capacity of the fan(s) and the current vehicle speed and shutter position. The final airflow request 365 is communicated to an airflow controller for implementation, and this iteration of the arbitration routine 360 ends (364).

Figure 7:
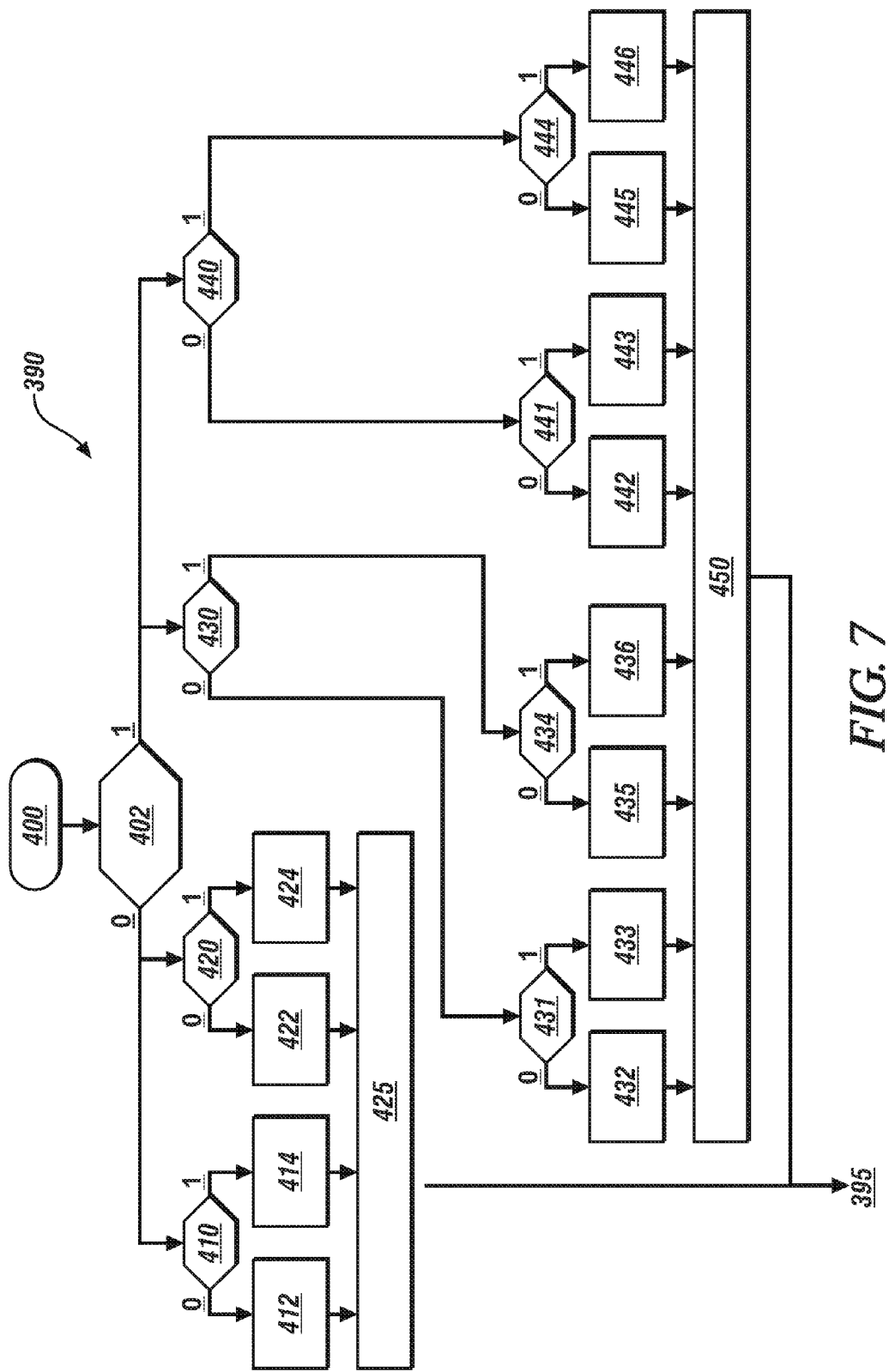
FIG. 7 illustrates elements of the fluid request control and arbitration logic routine for determining the coolant flow request that can be employed by a pump controller to control a coolant pump, in accordance with the disclosure.

FIG. 7 schematically shows elements of the fluid request control and arbitration logic routine 390 for determining the coolant flow request 395 that can be employed by a pump controller to control a coolant pump. Table 4 is provided as a key to FIG. 7 wherein the numerically labeled blocks and the corresponding functions are set forth as follows.

TABLE 4

| BLOCK | BLOCK CONTENTS |
|---|---|
| 400 | Start |
| 402 | Determine if inlet temperature sensor is in system |
| 410 | Is cooling request valid? |
| 412 | Set default pump request |
| 414 | Set pump request based upon cooling request |
| 420 | Is device temperature valid? |
| 422 | Set default pump request |
| 424 | Set pump request based upon device temperature |
| 425 | Arbitration to select maximum pump request |
| 430 | Is cooling request valid? |
| 431 | Is inlet temperature valid? |
| 432 | Set default pump request |
| 433 | Set pump request based upon cooling request |
| 434 | Is inlet temperature valid? |
| 435 | Set pump request based upon inlet temperature |
| 436 | Set pump request based upon cooling request and inlet temperature |
| 440 | Is device temperature valid? |
| 441 | Is inlet temperature valid? |
| 442 | Set default pump request |
| 443 | Set pump request based upon inlet temperature |
| 444 | Is inlet temperature valid? |
| 445 | Set pump request based upon device temperature |
| 446 | Set pump request based upon device temperature and inlet temperature |
| 450 | Arbitration to select maximum pump request |

Upon starting (400), it is determined whether the system is equipped with a temperature sensor configured to monitor the power electronics device, e.g., the device temperature sensor 222 shown with reference to FIG. 2 (402). When the system is not equipped with an inlet temperature sensor (402)(0), the system determines pump requests based upon whether the cooling request is valid (410) and whether the device temperature is valid (420). A cooling request is a demand for cooling from one or a plurality of the heat source devices, i.e., one of the power electronics device(s) of FIG. 2.

When the cooling request is invalid (410)(0), a default pump request is selected (412) and input to an arbitration block (425). The default pump request for an invalid cooling request is set to a calibration value based upon a preferred remedial action for the particular device, which can include an ON state resulting in a maximum coolant flowrate, or a PWM state resulting in a controlled coolant flowrate that is less than the maximum coolant flowrate. When the cooling request is valid (410)(1), the pump request is set based upon the cooling request (414) and input to the arbitration block (425). The pump request may include an OFF state, an ON state resulting in a maximum coolant flowrate, or a PWM state resulting in a controlled coolant flowrate that is less than the maximum coolant flowrate to achieve a preferred magnitude of heat rejection. A relation between the cooling request and the pump request including the minimum and maximum coolant flowrates and a cooling-related gradation of coolant flow can be developed experimentally, empirically, predictively, through modeling, or other suitable techniques, and executed using any suitable scheme, including e.g., a one-dimensional calibration table or an executable equation. A temperature of the device(s) can be determined by direct monitoring employing a device temperature sensor or by indirect monitoring employing empirical, predictive, modeling, or other suitable techniques.

When the device temperature is invalid (420)(0), a default pump request is selected (422) and input to the arbitration block (425). The default pump request for an invalid device temperature is set to a calibration value based up on a predicted remedial action desired for that particular device. When the device temperature is valid (420)(1), the pump request is set based upon the device temperature (424) and input to the arbitration block (425). The pump request may include an OFF state, an ON state resulting in a maximum coolant flowrate, or a PWM state resulting in a controlled coolant flowrate that is less than the maximum coolant flowrate to achieve a preferred device temperature. A relation between the preferred device temperature and the pump request including the minimum and maximum coolant flowrates and a device temperature gradation of coolant flow can be developed experimentally, empirically, predictively, through modeling, or other suitable techniques, and executed using any suitable scheme, including e.g., a one-dimensional calibration table or an executable equation. The arbitration block (425) selects one of aforementioned pump requests as the coolant flow request 395 for controlling the coolant pump. The selection includes selecting a maximum of the pump requests with an allowance for hysteresis.

When the system is equipped with an inlet temperature sensor (402)(1), the system determines pump requests based upon whether the cooling request is valid (430) and whether the device temperature is valid (440). A cooling request is a demand for cooling from one or a plurality of the heat source devices, i.e., one of the power electronics device(s) of FIG. 2.

When the cooling request is invalid (430)(0), it is determined whether the inlet temperature is valid (431). When the cooling request is invalid (430)(0) and the inlet temperature is invalid (431)(0), a default pump request is selected (432) and input to an arbitration block (450). The default pump request for an invalid cooling request is a function of the inlet temperature. When the cooling request is invalid (430)(0) and the inlet temperature is valid (431)(1), the pump request is set based upon the cooling request (433) and input to the arbitration block (450). The pump request may include an OFF state, an ON state resulting in a maximum coolant flowrate, or a PWM state resulting in a controlled coolant flowrate that is less than the maximum coolant flowrate to achieve a preferred magnitude of heat rejection. A relation between the cooling request and the pump request including the minimum and maximum coolant flowrates and a cooling-related gradation of coolant flow can be developed experimentally, empirically, predictively, through modeling, or other suitable techniques, and executed using any suitable scheme, including e.g., a one-dimensional calibration table or an executable equation. The cooling request is considered invalid when there is a loss of communications, or a signal status is unavailable or undetermined due to vehicle startup or shutdown sequence, or there is invalid data used by the routine that determines the cooling request.

When the cooling request is valid (430)(1), it is determined whether the inlet temperature is valid (434). When the cooling request is valid (430)(1) and the inlet temperature is invalid (434)(0), a pump request is selected based on the inlet temperature (435) and input to arbitration block (450). The pump request may include an OFF state, an ON state resulting in a maximum coolant flowrate, or a PWM state resulting in a controlled coolant flowrate that is less than the maximum coolant flowrate to achieve a preferred inlet temperature. A relation between the preferred inlet temperature and the pump request including the minimum and maximum coolant flowrates and an inlet temperature gradation in relation to coolant flow can be developed experimentally, empirically, predictively, through modeling, or other suitable techniques, and executed using any suitable scheme, including e.g., a one-dimensional calibration table or an executable equation.

When the cooling request is valid (430)(1) and the inlet temperature is valid (434)(1), a pump request is selected based on the inlet temperature and the cooling request (436) and input to arbitration block (450). The pump request may include an OFF state, an ON state resulting in a maximum coolant flowrate, or a PWM state resulting in a controlled coolant flowrate that is less than the maximum coolant flowrate to achieve a preferred inlet temperature and the preferred cooling request. A relation between the preferred inlet temperature, a preferred cooling request, and the pump request including the minimum and maximum coolant flowrates and gradations in cooling request and inlet temperatures in relation to coolant flow can be developed experimentally, empirically, predictively, through modeling, or other suitable techniques, and executed using any suitable scheme, including e.g., a two-dimensional calibration table or an executable equation.

When the device temperature is invalid (440)(0), it is determined whether the inlet temperature is valid (441). When the device temperature is invalid (440)(0) and the inlet temperature is invalid (441)(0), a default pump request is selected (442) and input to the arbitration block (450). The default pump request for an invalid device temperature is preferably a function of the inlet temperature, which may presumed as a maximum inlet temperature, or another suitable value that protects the device from overheating.

When the device temperature is invalid (440)(0) and the inlet temperature is valid (441)(1), the pump request is set based upon the device temperature (443) and input to the arbitration block (450). The pump request may include an OFF state, an ON state resulting in a maximum coolant flowrate, or a PWM state resulting in a controlled coolant flowrate that is less than the maximum coolant flowrate to achieve a preferred magnitude of heat rejection. A relation between the device temperature and the pump request including the minimum and maximum coolant flowrates and a cooling-related gradation of device temperatures can be developed experimentally, empirically, predictively, through modeling, or other suitable techniques, and executed using any suitable scheme, including e.g., a one-dimensional calibration table or an executable equation.

When the device temperature is valid (440)(1), it is determined whether the inlet temperature is valid (444). When the device temperature is valid (440)(1) and the inlet temperature is invalid (444)(0), a pump request is selected based on the device temperature (445) and input to arbitration block (450). The pump request may include an OFF state, an ON state resulting in a maximum coolant flowrate, or a PWM state resulting in a controlled coolant flowrate that is less than the maximum coolant flowrate to achieve a preferred device temperature. A relation between the preferred device temperature and the pump request including the minimum and maximum coolant flowrates and a device temperature gradation in relation to coolant flow can be developed experimentally, empirically, predictively, through modeling, or other suitable techniques, and executed using any suitable scheme, including e.g., a one-dimensional calibration table or an executable equation.

When the device temperature is valid (440)(1) and the inlet temperature is valid (444)(1), a pump request is selected based on the inlet temperature and the device temperature (446) and input to the arbitration block (450). The pump request may include an OFF state, an ON state resulting in a maximum coolant flowrate, or a PWM state resulting in a controlled coolant flowrate that is less than the maximum coolant flowrate to achieve a preferred device temperature and the preferred inlet temperature. A relation between the preferred device temperature, the preferred inlet temperature, and the pump request including the minimum and maximum coolant flowrates and a inlet temperature and device temperature gradations in relation to coolant flow can be developed experimentally, empirically, predictively, through modeling, or other suitable techniques, and executed using any suitable scheme, including e.g., a two-dimensional calibration table or an executable equation.

The arbitration block (450) selects one of aforementioned pump requests as the coolant flow request 395 for controlling the coolant pump. The selection includes selecting a maximum of the pump requests with an allowance for hysteresis.

The control scheme 300 for the exemplary power electronics cooling circuit 200 permits operation of a comprehensive air-cooling and liquid-cooling side power electronics strategy, by which equal fidelity is achieved on both sides. This includes permitting a request for a supplemental air flow cooling or ideal air flow cooling on a power electronics component level. The implementation for the control scheme 300 employs the same outputs for any different combination of components, allowing this strategy to be used on many applications in many different controllers without software changes. The coolant flow request 395 and the final airflow request 365 are preferably determined to achieve a preferred operating temperature of the power electronics device, thus operating the fluidic pump to control coolant flow through the fluid/air heat exchanger to reject heat from the power electronics device to the coolant and correspondingly operating the air pump and the shutter device to control airflow across the fluid/air heat exchanger to reject heat from the coolant to ambient air to achieve the preferred heat rejection from the power electronics device, while minimizing expenditure of energy to operate the fluidic pump and operate the air pump.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Vehicle system, comprising:
 a cooling circuit thermally coupled via a fluidic heat exchanger to a power electronics device, said cooling circuit comprising a fluidic pump fluidly connected to a fluid/air heat exchanger, an air pump configured to transfer air across the fluid/air heat exchanger, and a shutter device configured to control airflow across the fluid/air heat exchanger; and
 a controller controlling the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to achieve a preferred heat rejection from the power electronics device.

2. The vehicle system of claim 1, wherein the controller controlling the air pump and the shutter device to control airflow across the fluid/air heat exchanger to reject heat from the coolant to achieve the preferred heat rejection from the power electronics device comprises determining an airflow request associated with only a temperature of the cooling circuit when a cooling circuit temperature is valid and an outside air temperature is invalid, said airflow request based upon a direct relation between airflow across the fluid/air heat exchanger and the cooling circuit temperature.

3. The vehicle system of claim 2, wherein determining the airflow request comprises selecting zero airflow when the cooling circuit temperature is less than a minimum temperature and selecting a maximum airflow when the cooling circuit temperature is greater than a maximum temperature.

4. The vehicle system of claim 1, wherein the controller controlling the air pump and the shutter device to control airflow across the fluid/air heat exchanger to reject heat from the coolant to achieve the preferred heat rejection from the power electronics device comprises determining an airflow request associated with a cooling circuit temperature and an outside air temperature when the cooling circuit temperature and the outside air temperature are valid, said airflow request based upon a direct relation between the airflow across the fluid/air heat exchanger, the cooling circuit temperature, and the outside air temperature.

5. The vehicle system of claim 1, wherein the controller controlling the fluidic pump to control coolant flow through the fluid/air heat exchanger to reject heat from the power electronics device to the coolant comprises selecting a default pump request when a cooling request is invalid.

6. The vehicle system of claim 1, wherein the controller controlling the fluidic pump to control coolant flow through the fluid/air heat exchanger to reject heat from the power electronics device to the coolant comprises selecting a controlled coolant flowrate to achieve a preferred magnitude of heat rejection when a cooling request is valid.

7. The vehicle system of claim 1, wherein the controller controlling the fluidic pump to control coolant flow through the fluid/air heat exchanger to reject heat from the power electronics device to the coolant comprises selecting a pump request based on a device temperature for the power electronics device when the device temperature is valid and an inlet temperature is invalid.

8. The vehicle system of claim 1, wherein the controller controlling the fluidic pump to control coolant flow through the fluid/air heat exchanger to reject heat from the power electronics device to the coolant comprises selecting a pump request based on an inlet temperature of the coolant to the power electronics device and a temperature of the power electronics device of when the device temperature is valid and the inlet temperature is valid.

9. The vehicle system of claim 1, wherein the controller controlling the fluidic pump to control coolant flow through the fluid/air heat exchanger to reject heat from the power electronics device to the coolant comprises selecting a pump request based on an inlet temperature of the coolant to the power electronics device when a temperature of the power electronics device is invalid and the inlet temperature is valid.

10. The vehicle system of claim 1, wherein the controller controlling the fluidic pump to control coolant flow through the fluid/air heat exchanger to reject heat from the power electronics device to the coolant comprises selecting a default pump request when a temperature of the power electronics device is invalid and an inlet temperature of the coolant to the power electronics device is invalid.

11. The vehicle system of claim 1, wherein the controller controlling the fluidic pump to control coolant flow through the fluid/air heat exchanger to reject heat from the power electronics device to the coolant and operative to correspondingly control the air pump and the shutter device to control airflow across the fluid/air heat exchanger to reject heat from the coolant to achieve a preferred heat rejection from the power electronics device comprises controlling the fluidic pump to control coolant flow through the fluid/air heat exchanger and correspondingly controlling the air pump and the shutter device to control airflow across the fluid/air heat exchanger to achieve a preferred operating temperature of the power electronics device.

12. The vehicle system of claim 1, wherein the controller controlling the fluidic pump to control coolant flow through the fluid/air heat exchanger to reject heat from the power electronics device to the coolant and operative to correspondingly control the air pump and the shutter device to control airflow across the fluid/air heat exchanger to reject heat from the coolant to achieve a preferred heat rejection from the power electronics device comprises the controller balancing heat transfer across the power electronics device with heat transfer across the fluid/air heat exchanger.

13. Controller-implemented method for controlling a cooling circuit thermally coupled via a fluidic heat exchanger to an on-vehicle power electronics device, said cooling circuit comprising a fluidic pump fluidly connected to a fluid/air heat exchanger, an air pump configured to transfer air across the fluid/air heat exchanger, and a shutter device configured to control airflow across the fluid/air heat exchanger, the method comprising:
 controlling the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to achieve a preferred heat rejection from the power electronics device.

14. The method of claim 13, wherein controlling the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to achieve a preferred heat rejection from the power electronics device comprises controlling the fluidic pump to control coolant flow through the fluid/air heat exchanger and correspondingly controlling the air pump and the shutter device to control airflow across the fluid/air heat exchanger to achieve a preferred operating temperature of the power electronics device.

15. The method of claim 13, wherein controlling the fluidic pump to control coolant flow through the fluid/air heat exchanger to reject heat from the power electronics device to the coolant and correspondingly controlling the air pump and the shutter device to control airflow across the fluid/air heat exchanger to reject heat from the coolant to achieve a preferred heat rejection from the power electronics device comprises balancing heat transfer across the power electronics device with heat transfer across the fluid/air heat exchanger.

* * * * *